Feb. 3, 1970 W. R. LITTLE 3,493,880

VARIABLE GAIN AMPLIFIER

Filed April 23, 1968

INVENTOR
William Robert Little

BY J. O. Tresansky
ATTORNEY

United States Patent Office 3,493,880

Patented Feb. 3, 1970

3,493,880

VARIABLE GAIN AMPLIFIER

William R. Little, Seattle, Wash., assignor, by mesne assignments, to the United States of America as represented by the Secretary of the Navy Filed Apr. 23, 1968, Ser. No. 723,481

Int. Cl. H03f *1/32*

U.S. Cl. 330—23 7 Claims

ABSTRACT OF THE DISCLOSURE

A variable gain amplifier circuit using a common emitter transistor configuration to provide a wide and linear control range of operation. A variable capacitor in the collector-base circuit is used to neutralize the signal coupled through the base to collector capacitance of the transistor. A nonlinear resistance in the emitter to base circuit increases the linearity and control sensitivity of the amplifier cricuit. A thermistor and variable resistor may be connected in the base to emitter circuit to provide for temperature compensation.

Background of the invention

The present invention generally relates to variable gain amplifiers and more particularly to a variable gain amplifier circuit with a large and linear control range.

In the past, variable gain amplifier circuits, such as those used for automatic gain control (AGC) or time variable gain control (TVG), have been limited to between 35 and 45 db of useful range. Frequently these circuits have a nonlinear relationship between decibels of gain (or attenuation) and the control voltage. Excessive noise level, variation in tuned bandwidth as a function of gain, temperature sensitivity, and poor linearity for high level signals, are other frequent shortcomings.

For AGC use low noise at maximum gain setting and a large gain control range are desirable. For TVG use stability of control characteristics, temperature compensation, linearity of control function, and a large control range are desirable.

Summary of the invention

Accordingly, one object of the present invention is the provision of a new and improved variable gain amplifier circuit.

Another object of the instant invention is the provision of a new and improved variable gain tuned amplifier circuit having a large control range of operation.

A further object of this invention is the provision of a new and improved variable gain amplifier circuit which has a wide range of linear relationship between decibels of gain (or attenuation) and the control voltage.

Still another object of the subject invention is the provision of a new and improved variable gain amplifier circuit with low noise characteristics.

One other object of the instant invention is the provision of a new and improved variable gain amplifier which compensates for any change in temperature.

Briefly, in accordance with this invention the foregoing and other objects are attained by the use of a common emitter amplifier configuration in which the base to collector capacitance is neutralized and a nonlinear resistive element included in the emitter-base circuit. A thermistor variable resistive element may be included to provide temperature compensation.

Brief description of the drawings

A more complete appreciation of the invention will be readily obtained as the same becomes better understood by reference to the following detailed description when considered in connection with the accompanying drawings wherein.

Detailed description of the preferred embodiment

Figure 1:
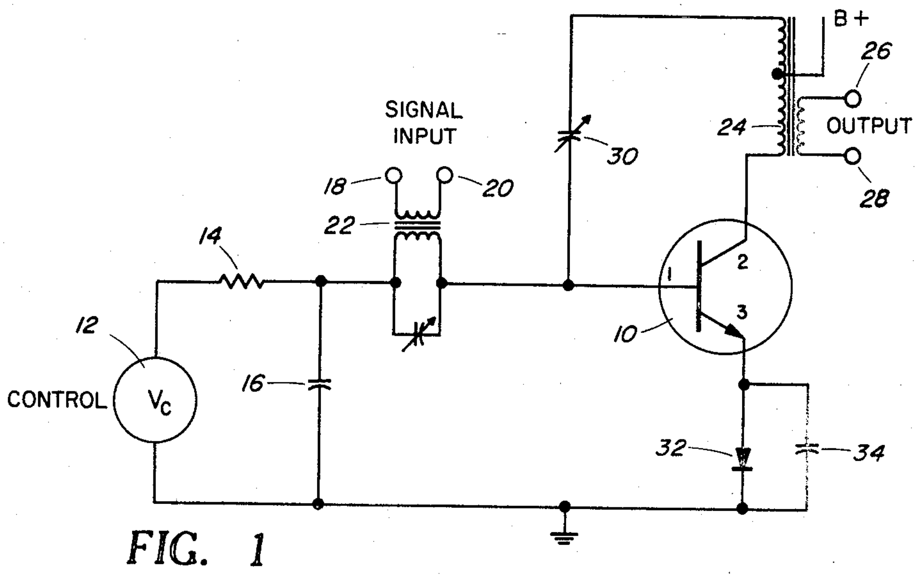
FIG. 1 is a schematic illustration of the preferred embodiment of the variable gain tuned amplifier circuit in accordance with this invention.

Referring now to the drawings wherein like reference numerals designate identical, or corresponding parts throughout the several views, and more particularly to FIG. 1 thereof wherein a variable gain amplifier circuit in accordance with the present invention is shown as including an active circuit element 10, such for example may be a conventional low level, low noise, high gain transistor such as types 2N2484 or 2N3117, having base, emitter and collector electrodes which is connected in a common emitter configuration. The gain of the amplifier circuit is controlled by varying the bias of transistor 10 through the use of a voltage source 12, such for example as a conventional variable D.C. voltage generator, the voltage of which is applied between the base and emitter of transistor 10 through a decoupling resistor 14. An input signal to be amplified is applied to input terminals 18 and 20 and then coupled to the base of transistor 10 through a conventional coupling transformer and tuned tank circuit 22. A capacitor 16 is connected across voltage source 12 and resistor 14 so as to prevent the A.C. input signal from affecting the D.C. control voltage source 12. The output of the amplifier circuit is obtained from the collector, through a conventional coupling transformer and tuned tank circuit 24 and appears at output terminals 26 and 28. It should be understood that the input and output coupling transformer and tank circuits 22 and 24 are for the purpose of providing a tuned amplifier capable of responding to a particular range of frequencies. It should further be understood that the invention is not so limited and may be used with untuned amplifiers capable of responding to any frequency. The transistor 10 is biased to its operating range by a unidirectional voltage source, such as a conventional battery B+ connected across the collector and base of transistor 10. The usefulness of the variable gain amplifier circuit of FIG. 1 may be greately extended by the use of a variable capacitor 30 connected between the base of transistor 10 and the coupling transformer and tank circuit 24. The effect of capacitor 30 is to neutralize the signal coupled through the base to collector capacitance of transistor 10. In particular, it has been found that careful neutralization may extend the gain control range of operation of the amplifier circuit to 90 db or more. The adjustment of the neutralization capacitor is best accomplished with the transistor bias (gain control voltage) adjusted for minimum gain. A high level signal, for example about 50 millivolts, at the tuned frequency is then applied to the input transformer 22. The neutralization capacitor 30 is then adjusted for minimum output at the collector circuit so as to obtain the desired neutralization.

The control sensitivity and linearity of the variable gain tuned amplifier circuit of the subject invention may be increased by inclusion of a nonlinear resistance 32, such for example as a conventional diode, in the emitter-base circuit of transistor 10. Optionally, a capacitor 34, to bypass the emitter resistor 32, may be used since it acts as an A.C. emitter ground and accordingly will have considerable influence on the amplifier circuit characteristics for high-level input signals.

Figure 2:
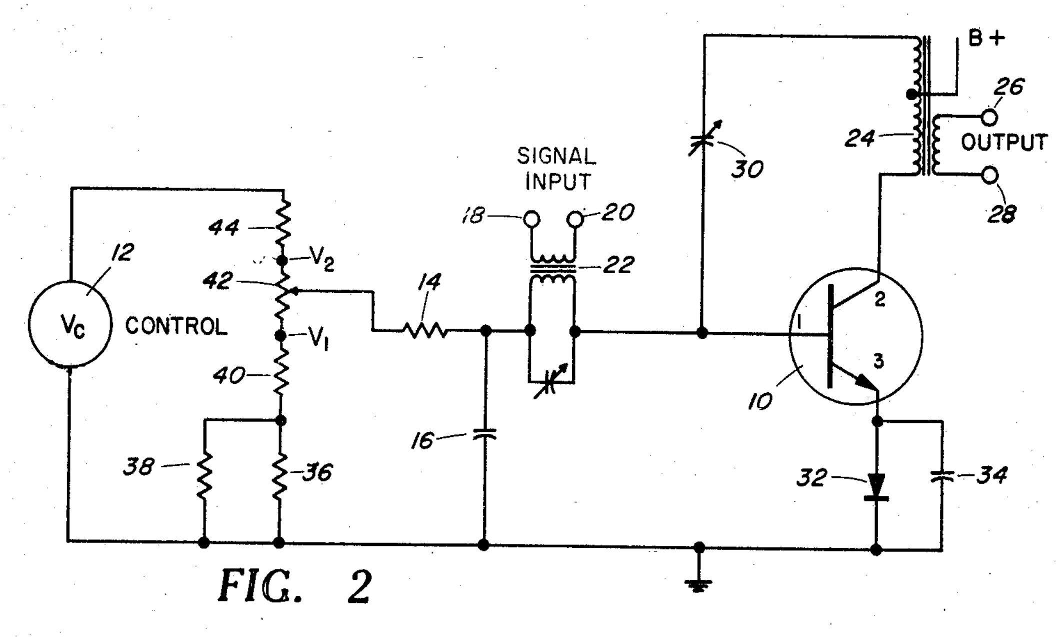
FIG. 2 is a schematic illustration of an alternative embodiment of the variable gain tuned amplifier circuit in accordance with this invention with provisions for temperature compensation.

It will be apparent that when the nonlinear resistance 32 is a conventional solid-state diode the variable gain amplifier circuit may be sensitive to temperature changes. Accordingly, FIG. 2 shows a modified circuit configuration for providing temperature compensation to the variable gain amplifier circuit of FIG. 1 by connecting across voltage source 12 a conventional thermistor 36, such for example as a "Fenwal" KB2751 thermistor, shunted by a resistance 38 and a serial arrangement of resistances 40, 42 and 44 operating as a voltage divider. The voltages $V_1$ and $V_2$ shown in FIG. 2, respectively represent the control voltage corresponding to the greatest attenuation and the maximum gain desired. The value of resistance 42, which is a control potentiometer, is selected in ohms per db of control range (for example 10 ohms per db of control range). The current in the control circuit $I_t$ is then determined as a function of temperature according to the equation $$I_t=\frac{(V_2-V_1)_t}{\text{Resistor 42}}$$

The values of $V_2-V_1$ are derived from test data with the uncompensated circuit of FIG. 1. Having determined the value of $I_t$ required to achieve the proper control sensitivity, a value for the control voltage $Vc$ and resistor 44 can be determined from the circuit equation $$Vc=V_2+\text{resistor } \mathbf{44}\ (I_t)$$

The thermistor and series and shunt resistors can be determined from the equation $$R_{st}=\frac{V_1}{I_t}$$

where $R_{st}$ is the resistance of the thermistor network.

It should now be apparent that the variable gain amplifier circuit of the herein described invention achieves a wide and linear control range with low sensitivity to temperature changes. It will also be apparent that although the invention has been described with the use of a three terminal transistor that it is not so limited and may be used with FET transistors. Likewise, numerous temperature compensation techniques other than the aforedescribed one may be used.

Obviously, numerous modifications and variations of the present invention are possible in light of the above teachings. It is therefore understood that within the scope of the appended claims the invention may be practiced otherwise than as specifically described herein.

What is claimed as new and desired to be secured by Letters Patent of the United States is:

1. A variable gain amplifier circuit comprising:

an active semiconductor circuit element having at least base, emitter and collector electrodes;

a first circuit path connected between said base and emitter electrodes which includes the following interconnected circuit elements;

means for providing an A.C. input signal, means for providing a D.C. control voltage for said semiconductor element whereby the gain of said amplifier circuit may be varied; and nonlinear resistive impedance means for increasing the linearity and control sensitivity of said amplifier circuit, and a second circuit path connected between said base and collector electrodes which includes the following interconnected circuit elements:

means for providing a unidirectional bias signal for said semiconductor element, means for providing an output signal, and variable reactive impedance means for neutralizing the signal coupled through the base to collector capacitance of said semiconductor element.

2. A variable gain amplifier circuit as in claim 1 wherein said active semiconductor circuit element is a transistor.

3. A variable gain amplifier circuit as in claim 1 wherein said means for providing an A.C. input signal includes a tuned tank circuit.

4. A variable gain amplifier circuit as in claim 1 wherein said nonlinear resistive impedance means is a diode.

5. A variable gain amplifier circuit as in claim 1 wherein said variable reactive impedance means includes a variable capacitor.

6. A variable gain amplifier circuit as in claim 1 wherein said first circuit path further includes means for providing temperature compensation for said amplifier circuit.

7. A variable gain amplifier circuit as in claim 6 wherein said means for providing temperature compensation includes a thermistor.

References Cited

UNITED STATES PATENTS 3,050,644 8/1962 Ironside ............ 330—23 X

FOREIGN PATENTS 865,799 4/1961 Great Britain.

ROY LAKE, Primary Examiner

L. J. DAHL, Assistant Examiner

U.S. Cl. X.R.

330—29, 40